United States Patent

[11] 3,615,736

[72] Inventor Frank E. Stone
Trumbull, Conn.
[21] Appl. No. 789,402
[22] Filed Jan. 6, 1969
[45] Patented Oct. 26, 1971
[73] Assignee Enthone, Incorporated
New Haven, Conn.

[54] ELECTROLESS COPPER PLATING BATH
23 Claims, No Drawings

[52] U.S. Cl. .......... 106/1,
117/47 A, 117/50, 117/160 R
[51] Int. Cl. .......... B44d 1/092,
C23c 3/02
[50] Field of Search .......... 106/1;
117/47, 160, 50

[56] References Cited
UNITED STATES PATENTS
3,377,144 4/1968 Toriggi et al. .......... 106/1

*Primary Examiner*—Alfred L. Leavitt
*Assistant Examiner*—Janyce A. Bell
*Attorneys*—Elwood J. Schaffer and Roger J. Drew

ABSTRACT: High stability electroless copper plating baths containing as a stabilizer a small amount of o-phenanthroline and of iodide ions.

ELECTROLESS COPPER PLATING BATH

BACKGROUND OF THE INVENTION

1. Field of the Invention

This invention relates to electroless copper plating, and more particularly to new, high stability chemical reduction copper plating solutions. Additionally this invention relates to new concentrate compositions and additive compositions especially well suited for use in forming the high stability electroless copper plating solutions herein and for addition thereto as stabilizer, and to a method for the electroless plating of copper involving the use of the high stability electroless copper. 2. Description of the Prior Art Electroless copper plating is of considerable importance commercially. A principal application is in the electronics industry, for instance in the production of printed circuits. In the latter use, electroless copper is employed to render plastic surfaces electrically conductive, especially in the manufacture of "plated-through hole" printed circuit boards. Other applications in the electronics industry take advantage of the high electrical conductivity of thin deposits of electroless copper, as in the coating of epoxy surfaces to produce additive type printed circuits and the plating of magnetic tape.

Commercial formulations of electroless copper plating compositions are usually supplied as two solutions or powders with the copper salt in one solution or powder and the reducing agent, frequently formaldehyde, in the other. The two solutions or powders and water are mixed together just prior to use, whereby the reduction of the copper ions commences shortly thereafter to plate out metallic copper. In certain commercial formulations, in the case of the solutions, both the copper salt and reducing agent may be in one of the solutions with the pH of the solution maintained low enough and on the acid side to prevent the redox reaction, and the other solution, which is an alkaline solution, will contain the alkali and complexing agent for cupric ions.

The prior art electroless copper plating solutions are characterized by being very unstable compositions and undergoing a spontaneous decomposition after only a short period of life, which is a matter of typically a few hours. The copper precipitates out of the solution and metallic copper particles can usually be observed at the bottom of the tank or container holding the solution. The decomposed solutions are usually not regenerable or recoverable, and must be discarded.

2, 9-Dimethylphenantroline and 4, 7-dipheynyl-2, 9-dimethyl-1, 10-phenanthroline have been reported heretofore as stabilizers for electroless copper plating solutions. The mechanism of such compounds has been to form a chelated compound selectively with cuprous ion in the solution thereby stabilizing the solution.

SUMMARY OF THE INVENTION

In accordance with the present invention, I have found that alkaline electroless copper plating solutions are provided of considerably greater stability than the prior electroless copper plating solutions previously referred to herein by incorporating into or adding to the plating solution as stabilizer a small, effective amount of o-phenanthroline and of iodide ions. The electroless copper plating solutions or baths of this invention were found to be of considerably greater stability than alkaline electroless copper plating solutions stabilized with iodide ion alone, o-phenanthroline alone, and 2, 9-dimethyl phenanthroline alone, and this considerably greater stability provided by the synergistic combination of the o-phenanthroline and iodide ions was unexpected and surprising.

The high stability electroless copper plating solution or bath of this invention, in its broader aspects, comprises an alkaline aqueous solution containing copper ions, a complexing agent for cupric ion, a reducing agent for the ionic copper, and as the stabilizer, a small effective amount of o-phenanthroline and of iodide ions.

The small amount of o-phenanthroline and of iodide ions is an amount sufficient to stabilize the bath against its premature decomposition. However, the amount of o-phenanthroline and of iodide ions utilized in the electroless copper plating baths herein should be less than that amount of such ingredients which will prevent copper from being deposited from the bath.

This invention also comprehends concentrate compositions especially well suited for use in forming the high stability electroless copper plating solutions herein, and in their broader aspects each comprising a mixture of a water-soluble copper salt, a reducing agent for ionic copper, and small amounts of o-phenanthroline and of a source of iodide ions, usually a water-soluble iodide, for example an alkali metal iodide, e.g. sodium or potassium iodide. The small amounts of o-phenanthroline and of the source of iodide ions in the concentrate composition are amounts of such materials insufficient to prevent copper from depositing from the ultimate electroless copper plating bath, and which are sufficient either with or without separately added o-phenanthroline and iodide ion source to stabilize the electroless copper plating bath.

In still another embodiment of this invention, additive compositions are provided for addition as stabilizer to alkaline electroless copper plating solutions or baths. The additive composition herein, in its broader aspects, comprises a mixture of o-phenanthroline and a source of iodide ions.

Other ingredients can also be present in the additives, if desired, such as, for example, an inert diluent, e.g. an inert aqueous liquid solvent, usually water, the alkali metal hydroxide and/or the alkali metal carbonate.

The source of the copper ions in the plating solutions herein is usually a water-soluble copper salt, e.g. copper sulfate, copper nitrate or copper chloride.

The complexing agent for cupric ion is usually Rochelle salt, although other suitable complexers for cupric ion may be utilized instead of the Rochelle salts, if desired. Exemplary of such other complexing agents are ethylenediaminetetraacetic acid and alkali metal and alkaline earth metal salts thereof, nitrilotriacetic acid and alkali metal and alkaline earth metal salts thereof, ethylenediamine and certain derivatives thereof, and amino acid complexing agents.

Although it is not known with certainty, it is believed the iodide ion and o-phenanthroline stabilize the electroless copper plating baths by forming a co-complex or addition compound with cuprous ion. The co-complex or addition compound is possibly either (1)

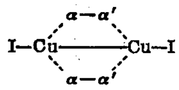

or (2)

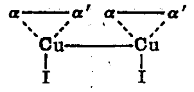

or (3)

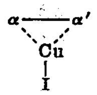

and wherein α and α' denote the 1 and 10 positions of o-phenanthroline in all of such formulas (1), (2) and (3).

DESCRIPTION OF THE PREFERRED EMBODIMENTS

The o-phenanthroline is preferably present in the electroless copper plating baths of this invention in an amount in the range of $1\times10^{14}$ to $1\times10^{12}$ gram per liter. The iodide ion is preferably present in the electroless copper plating baths in an amount equivalent to $1\times10^{14}$ to $1\times10^{12}$ gram per liter of sodium iodide or potassium iodide.

Formaldehyde is the preferred reducing agent herein and is conveniently added as an aqueous solution, such as formalin. Compounds or materials capable of providing formaldehyde in the plating solution under the conditions of the plating, for example paraformaldehyde and trioxane, are also utilizable. Less preferred reducing agents for use herein are amine boranes, hydrazine, substituted pyridines, alkali metal and alkaline earth metal hypophosphites, phosphites, hyposulfites, sulfites, sulfoxylates and thiosulfates; hydrazoic acid and azides, and alkali metal and alkaline earth metal formates.

The pH of the electroless copper plating solutions herein is preferably 10—14. The pH is provided by addition of an alkaline material or compound, preferably an alkali metal hydroxide, e.g. NaOH or KOH, in amount sufficient to provide the solution with the pH within the range of 10 to 14. Most preferably an alkali metal carbonate, e.g. sodium or potassium carbonate, is present in the plating bath or solution along with the alkali metal hydroxide. An especially preferred pH of the electroless copper plating solution herein is in the range of about 11.5—12.5.

Preferred temperatures of the plating solutions of this invention for plating catalytic surfaces are in the range from about 60° F. —90° F.

A preferred electroless copper aqueous plating solution or bath herein is the following:

| | |
|---|---|
| Soluble Copper salt | 20–26 g./l. |
| Rochelle salt | 40–55 g./l. |
| Alkali metal hydroxide | 10–18 g./l. |
| Formaldehyde (37%) | 100–150 ml./l. |
| o-Phenanthroline | $1\times10^{-14}$–$1\times10^{-12}$ g./l. |
| Sodium iodide or potassium iodide | $1\times10^{-14}$–$1\times10^{-12}$ g./l. |
| Alkali metal carbonate | 2–10 g./l. |

The preferred electroless copper plating solution may also contain a small amount of a suitable mineral acid, for example sulfuric acid, preferably of analytic reagent grade, in amount sufficient to aid in maintaining the pH of the plating solution or bath within the preferred pH range or 10 to 14 or within the especially preferred pH range of about 11.5–12.5.

Concentrate compositions especially well suited for use in forming the high stability electroless copper plating solutions herein are preferably aqueous acid solutions of the soluble copper salt, the reducing agent for ionic copper, preferably formaldehyde, o-phenanthroline, and the soluble source of iodide ions. The pH of the aqueous acid concentrate solutions is maintained on the acid side and sufficiently below pH 7 to prevent any substantial precipitation of copper therefrom as a cupric hydroxide-containing precipitate and as metallic copper by a redox reaction by the presence of any suitable acid material, usually a mineral acid, e.g. sulfuric acid, as an ingredient of the concentrate solution and in an amount sufficient to accomplish this. One of ordinary skill in this art would readily know when cupric hydroxide was precipitated in the concentrate solution due to the characteristic blue color of the cupric hydroxide, and would also know when metallic copper was precipitated in the bath due to the characteristic reddish color of the metallic copper and hence would know when the pH of the concentrate solution was too high. Copper oxides may also be present in the cupric hydroxide-containing precipitate. The pH of such acid concentrate solutions is preferably maintained at a pH not above pH 2.8, which is sufficiently acid to prevent the aforementioned undesirable precipitations for occurring.

The acid concentrate solutions herein preferably contain the following constituents in proportions within the percentage ranges hereafter specified:

| | % by Weight |
|---|---|
| $CuSO_4 \cdot H_2O$ | from about 5–9 |
| HCHO (37% concentration) | from about 35–45 |
| o-Phenanthroline | from about $3\times10^{-15}$–$3\times10^{-13}$ |
| NaI or KI | from about $3\times10^{-15}$–$3\times10^{-13}$ |
| $H_2SO_4$ (Analytic reagent grade) | from about 0.02–0.04 |
| $H_2O$ | balance |

TABLE 1

| | Test Run 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| Bath constituents (ml./l.): | | | | | | | | | | | | | | | | | | | | |
| Enplate Cu-402A (1L15760) | 300 | 300 | | | | | | | | | | | | | | | | | | |
| Enplate Cu-402A (1B03850) | | | 300 | | | | | | | | | | | | | | | | | |
| Enplate Cu-402A (1L15750) | | | | 300 | 300 | 300 | 300 | 300 | 300 | 300 | 300 | 300 | 300 | 300 | | | | | | |
| Enplate Cu-402A (1C08854) | | | | | | | | | | | | | | | 300 | 300 | 300 | 300 | 300 | 300 |
| Enplate (Cu-402B (1K09750) | 300 | 300 | | | | | | | 300 | 300 | 300 | 300 | 300 | 300 | 300 | 300 | 300 | 300 | 300 | 300 |
| Enplate Cu-402B (1J05754) | | | 300 | | | | | | | | | | | | | | | | | |
| Enplate Cu-402B (1L18762) | | | | 300 | 300 | 300 | 300 | 300 | | | | | | | | | | | | |
| D.M. $H_2O$ (ml./l.) | 400 | 400 | 400 | 400 | 400 | 400 | 400 | 400 | 400 | 400 | 400 | 400 | 400 | 400 | 400 | 400 | 400 | 400 | 400 | 400 |
| NaI, U.S.P. (10 g./l. in $H_2O$) (g./l.) | | 0.2 | | | | | | | | | | | | | | 0.01 | | 0.01 | 0.01 | 0.001 |
| o-Phenanthroline (g./l.) | | | | | 1.0 | [2] 0.05 | [2] 0.01 | [2] 0.001 | | [2] 0.0005 | [1] 0.0001 | [1] 0.00001 | | [1] 0.0001 | | [1] 0.0005 | | [2] 0.0005 | [2] 0.01 | [2] 0.001 |
| Appearance of plate | (3) | (3) | (3) | (3) | (4) | | | (5) | (3) | (3) | (3) | (3) | (3) | (3) | (3) | (4) | (3) | (3) | | (3) |
| Life of bath (in hours) | ~24 | ~20 | ~20 | ~24 | ~2 | ~20 | ~60 | ~60 | ~24 | ~48 | ~2 | ~24 | ~24 | ~2 | ~24 | ~216 | ~20 | ~100 | ~144 | ~168 |

[1] 0.05 g./l. in $CH_3OH$.
[2] 5 g./l. in $CH_3OH$.
[3] High gloss.
[4] Discolored.
[5] Good gloss.

NOTE.—All baths static; 400 ml. quantities

The additive compositions herein can be a liquid or solid, or of a consistency between a liquid and solid, e.g. a semiliquid or semisolid. The additive compositions can contain the mixture of o-phenanthroline and the iodide ions, or source of iodide ions, for example an alkali metal iodide, e.g. NaI or KI, within quite broad proportion ranges so long as the amounts of such materials are insufficient to prevent copper from depositing from the ultimate electroless copper plating bath. The solid additive compositions will typically contain amounts of o-phenanthroline and the alkali metal iodide within the proportion ranges of, by weight, from about 1.0–99.0 percent of the o-phenanthroline and from about 99.0–1.0 percent of the alkali metal iodide. The liquid additive compositions containing the iodide ions and o-phenanthroline, which are usually aqueous solutions, will typically contain from about 0.07–7 grams per liter of the iodide ions and from about .07–7 grams per liter of the o-phenanthroline.

Tests were carried out to compare the stability of chemical reduction copper plating baths containing only iodide ions as additive, only o-phenanthroline as additive, iodide ions plus o-phenanthroline as additive, and no additive. The results are set forth in table 1 which follows:

The test results of table 1 show the considerable improvement in stability of the bath provided by the combination of the iodide ions and o-phenanthroline as additive over either of these materials used alone in the bath or in the absence of any such additives in the bath.

In table 1, the composition of each Enplate Cu-402A was:

| | % by Weight |
|---|---|
| $CuSO_4 \cdot 5H_2O$ | 7.1 |
| $H_2SO_4$(Analytic reagant grade) | 0.03 |
| Formaldehyde (37%) | 38.3 |
| $H_2O$ | 54.57 |

and the composition of each Enplate Cu-402B was:

| | % by weight |
|---|---|
| $H_2O$ | 78.0 |
| NaOH | 4.66 |
| $Na_2CO_3$ | 1.44 |
| Rochelle Salt | 15.9 |

Enplate is a trademark of Enthone, Incorporated. "D.M. $H_2O$" in table 1 and in tables 2 and 3 hereinafter set forth means deionized water, which is water that has been purified by removal of foreign ions therefrom.

Additional tests were conducted to compare the stability of prior chemical reduction copper plating baths containing iodide ions plus o-phenanthroline as additive, only o-phenanthroline as additive, only 2, 9-dimethyl-o-phenanthroline as additive, and no additive. The results are set forth in table 2 which follows:

The considerable improvement in stability of the bath provided by the combination of iodide ions and o-phenanthroline as additive over the o-phenanthroline alone in the bath, the 2, 9-dimethyl-o-phenanthroline used alone in the bath, and no such additives in the bath, is shown by the test results of table 2.

In table 2 and also in table 3 hereinafter set forth, the composition of each Enplate Cu–402A is the same as that of the Enplate Cu–402A of table 1 previously set forth herein, and the composition of Enplate Cu–402B is the same as that of each Enplate Cu–402B of table 1 herein.

Additional testing was carried out to compare the stability of prior chemical reduction copper plating baths containing only iodide ions as the additive, iodide ions plus o-phenanthroline as the additive, and no additive. The test results are set forth in Table 3 which follows:

TABLE 3

| | Test Run | | | |
|---|---|---|---|---|
| | 31 | 32 | 33 | 34 |
| Bath constituents (ml./l.): | | | | |
| Enplate Cu–402A | 300 | 300 | 300 | 300 |
| Enplate Cu–402B | 300 | 300 | 300 | 300 |
| D.M. $H_2O$ (ml./l.) | 400 | 400 | 400 | 400 |
| NaI, U.S.P. (10 g./l. $H_2O$)(g./l.) | | 0.02 | 0.01 | 0.01 |
| o-Phenanthroline (5g./l. in $CH_3OH$) (g./l.) | | | | 0.0005 |
| Life of bath (in hours) | ~24 | ~40 | ~64 | ~200 |

The considerable improvement in stability of the bath provided by the combination of iodide ions and o-phenanthroline as the additive over the iodide ions alone as additive and no additive is also shown by the test results of table 3.

While the novel features of the invention have been disclosed herein and are specified in the annexed claims, it will be understood that various omissions, substitutions and changes may be made by those skilled in the art without departing from the spirit of the invention.

I claim:

1. An electroless copper alkaline plating solution comprising an aqueous alkaline solution containing copper ions, a complexing agent for cupric ion, a reducing agent for the copper ions, and as a stabilizer a small amount, sufficient to stabilize the solution against spontaneous decomposition, of o-phenanthroline and of iodide ions, the amount of said o-phenanthroline and of said iodide ions being insufficient to prevent copper from depositing from said solution.

2. The plating solution of claim 1 wherein the reducing agent is formaldehyde.

3. The plating solution of claim 1 further characterized by containing an alkaline compound in amount sufficient to provide the solution with a pH in the range of 10 to 14.

4. The plating solution of claim 3 wherein the iodide ion is present in amount equivalent to about 0.0001–0.01 g./l. of sodium iodide or potassium iodide and the o-phenanthroline in amount of about 0.0001–0.01 g./l.

5. The plating solution of claim 3 wherein the alkaline compound is an alkali metal hydroxide.

TABLE 2

| | Test Run | | | | | | | | | |
|---|---|---|---|---|---|---|---|---|---|---|
| | 21 | 22 | 23 | 24 | 25 | 26 | 27 | 28 | 29 | 30 |
| Bath constituents (4 liter baths) (ml./l.): | | | | | | | | | | |
| Enplate Cu–402A (1C08852) | | | | | | | 300 | 300 | 300 | 300 |
| Enplate Cu–402A (1C08854) | 300 | 300 | 300 | 300 | 300 | 300 | | | | |
| Enplate Cu–402B (1K09750) | 300 | 300 | | | | | | | | |
| Enplate Cu–402B (1L15766) | | | 300 | 300 | 300 | 300 | | | | |
| Enplate Cu–402B (1E15852) | | | | | | | 300 | 300 | 300 | 300 |
| D.M. $H_2O$ (ml./l.) | 400 | 400 | 400 | 400 | 400 | 400 | 400 | 400 | 400 | 400 |
| NaI, U.S.P. (10 g./l. in $H_2O$) (g./l.) | | 0.01 | | 0.001 | | 0.01 | | | 0.01 | |
| o-Phenanthroline (g./l.) [1] | | 0.0005 | | 0.001 | | 0.0005 | | 0.0005 | 0.0005 | |
| 2,9-dimethyl-o-phenanthroline (g./l.) [1] | | | | | | | | | | 0.0005 |
| Appearance of plate | (2) | (2) | (2) | (2) | (2) | (2) | (2) | (2) | (2) | (3) |
| Life of bath (in hours) | [4] ~24 | [4] ~192 | [4] ~36 | [5] ~110 | [6] ~36 | [6] ~276 | [7] ~24 | [7] ~20 | [8] ~84 | [7] ~3 |

[1] 5 g./l. in $CH_3OH$.
[2] High gloss.
[3] Low gloss.
[4] Static.
[5] Static; liner broke after 4 days.
[6] Aerated; during and after plating (½ hr.) only.
[7] Decomposition after 16 days=100%.
[8] Decomposition after 16 days=16%.

6. The plating solution of claim 5 further characterized by containing an alkali metal carbonate in addition to the alkali metal hydroxide, and wherein the reducing agent is formaldehyde.

7. The plating solution of claim 5 wherein the alkali metal hydroxide is sodium hydroxide and the alkali metal carbonate is sodium carbonate.

8. The plating solution of claim 7 wherein the cupric ion complexing agent is Rochelle salt.

9. A composition for use in electroless copper plating baths comprising a mixture of o-phenanthroline and a source of iodide ions.

10. A liquid additive composition for electroless copper plating baths comprising a mixture of o-phenanthroline, iodide ions and an aqueous liquid solvent.

11. A concentrate composition especially well adapted for use in forming high stability electroless copper plating solutions comprising a mixture of a water-soluble copper salt, a reducing agent for ionic copper, o-phenanthroline, and a source of iodide ions, the amount of o-phenanthroline and of the iodide ion source being a small amount of each sufficient to stabilize the ultimate electroless copper plating solution against spontaneous decomposition but insufficient to prevent copper from depositing from said plating solution.

12. An aqueous acid concentrate solution especially well adapted for use in forming high stability electroless copper plating solutions comprising an aqueous acid solution of a water-soluble copper salt, a reducing agent for ionic copper, o-phenanthroline, and a water-soluble source of iodide ions, the pH of said concentrate solution being sufficiently below pH 7 to prevent any substantial precipitation of copper therefrom as a cupric hydroxide-containing precipitate and as metallic copper by a redox reaction, the amount of o-phenanthroline and of the iodide ion source being a small amount of each sufficient to stabilize the ultimate electroless copper plating solution against spontaneous decomposition but insufficient to prevent copper from depositing from said plating solution.

13. The concentrate of claim 12 wherein the source of iodide ions is a material selected from the group consisting of sodium iodide and potassium iodide.

14. The concentrate solution of claim 12 wherein the reducing agent for ionic copper is formaldehyde, and also containing an acid material in amount sufficient to maintain the pH of the concentrate solution sufficiently below pH7 to prevent any substantial precipitation of copper therefrom as a cupric hydroxide-containing precipitate and as metallic copper by a redox reaction.

15. An aqueous acid concentrate solution especially well adapted for use in forming high stability electroless copper plating solutions containing the following constituents in proportions within the percentage range specified:

| | % by Weight |
|---|---|
| $H_2SO_4$(Analytic reagent grade | from about 0.02–0.04 |
| $CuSO_4 \cdot 5H_2O$ | from about 5–9 |
| HCHO (37% concentration) | from about 35–45 |
| o-Phenanthroline | from about $3\times10^{15}$–$3\times10^{13}$ |
| NaI or KI | from about $3\times10^{15}$–$3\times10^{13}$ |
| $H_2O$ | balance, |

the pH of said concentrate solution being sufficiently below pH 7 to prevent any substantial precipitation of copper therefrom as a cupric hydroxide-containing precipitate and as metallic copper by a redox reaction.

16. An electroless copper aqueous alkaline plating solution containing the following constituents in amounts within the proportion ranges specified:

| | |
|---|---|
| Soluble Copper salt | 20–26 g./l. |
| Rochelle salt | 40–55 g./l. |
| Alkali metal hydroxide | 10–18 g./l. |
| Formaldehyde (37% concentration | 100–150 ml./l. |
| o-Phenanthroline | $1\times10^{14}$–$1\times10^{12}$ g./l. |
| Sodium iodide | $1\times10^{14}$–$1\times10^{12}$ g./l. |
| Alkali metal carbonate | 2–10 g./l. |

the solution having a pH in the range of 10 to 14.

17. The plating solution of claim 16 wherein the copper salt is copper sulfate.

18. An electroless copper aqueous alkaline plating solution containing the following constituents in amounts within the proportion ranges specified:

| | |
|---|---|
| Soluble Copper Salt | 20–26 g./l. |
| Rochelle salt | 40–55 g./l. |
| Alkali metal hydroxide | 10–18 g./l. |
| Formaldehyde (37% concentration) 100–150 ml./l. | |
| o-Phenanthroline | $1\times10^{14}$–$1\times10^{12}$ g./l. |
| Potassium iodide | $1\times10^{14}$–$1\times10^{12}$ g./l. |
| Alkali metal carbonate | 2–10 g./l. |

the solution having a pH in the range of 10 to 14.

19. An additive composition for electroless copper plating baths comprising a mixture of o-phenanthroline, a source of iodide ions, and an inert diluent.

20. The composition of claim 19 wherein the diluent is at least one material selected from the group consisting of an alkali metal hydroxide and an alkali metal carbonate.

21. The composition of claim 19 wherein the iodide ion source is an alkali metal iodide.

22. The composition of claim 21 wherein the alkali metal iodide is sodium iodide.

23. The composition of claim 21 wherein the alkali metal iodide is potassium iodide.

PO-1050
(5/69)

UNITED STATES PATENT OFFICE
CERTIFICATE OF CORRECTION

Patent No. 3,615,736 Dated October 26, 1971

Inventor(s) Frank E. Stone

It is certified that error appears in the above-identified patent and that said Letters Patent are hereby corrected as shown below:

Column 1, line 48, "2,9-Dimethylphenantroline" should read --2,9-Dimethylphenanthroline--; line 48, "4,7-dipheynyl-2,9-" should read --4,7-diphenyl-2,9- --. Column 2, line 69, "$1x10^{14}$ to $1x10^{12}$" should read --$1x10^{-4}$ to $1x10^{-2}$--; line 71, "$1x10^{14}$ to $1x10^{12}$" should read --$1x10^{-4}$ to $1x10^{-2}$--. Column 3, line 29, "$1x10^{14}$ - $1x10^{12}$" should read --$1x10^{-4}$ - $1x10^{-2}$--; line 30, "$1x10^{14}$ - $1x10^{12}$" should read --$1x10^{-4}$ - $1x10^{-2}$--; line 72, "$3x10^{15}$ - $3x10^{13}$" should read --$3x10^{-5}$ - $3x10^{-3}$--; line 73, "3x10 $1/3^{5}$- $3x10^{13}$" should read --$3x10^{-5}$ - $3x10^{-3}$--; line 74, "H2SO4" should read --$H_2SO_4$--. Column 4, line 13, under Test Run 16 of Table 1, "$^{1}0.0005$" should read --$^{2}0.0005$--. Column 5, line 33 "CuSO4·a5H2O" should read --$CuSO_4 \cdot 5H_2O$--. Column 7, line 5, "5" should read --6--. Column 8, line 7, "$3x10^{15}$ - $3x10^{13}$" should read --$3x10^{-5}$ - $3x10^{-3}$--; line 9, "$3x10^{15}$ - $3x10^{13}$" should read --$3x10^{-5}$ - $3x10^{-3}$--; line 23, "$1x10^{14}$ - $1x10^{12}$" should read --$1x10^{-4}$ - $1x10^{-2}$--; line 24, "$1x10^{14}$ - $1x10^{12}$" should read --$1x10^{-4}$ - $1x10^{-2}$--; line 37, "$1x10^{14}$ - $1x10^{12}$" should read --$1x10^{-4}$ - $1x10^{-2}$--; line 38, "$1x10^{14}$ - $1x10^{12}$" should read --$1x10^{-4}$ - $1x10^{-2}$--.

Signed and sealed this 18th day of April 1972.

(SEAL)
Attest:

EDWARD M.FLETCHER,JR.
Attesting Officer

ROBERT GOTTSCHALK
Commissioner of Patents